United States Patent [19]
Sferlazzo

[11] Patent Number: 5,113,074
[45] Date of Patent: May 12, 1992

[54] ION BEAM POTENTIAL DETECTION PROBE

[75] Inventor: Piero Sferlazzo, Linnfield, Mass.

[73] Assignee: Eaton Corporation, Cleveland, Ohio

[21] Appl. No.: 647,509

[22] Filed: Jan. 29, 1991

[51] Int. Cl.⁵ .............................................. H01J 37/317
[52] U.S. Cl. ................................... 250/492.2; 250/251
[58] Field of Search ............... 250/492 R, 442.21, 397, 250/251; 324/71.3

[56] References Cited

U.S. PATENT DOCUMENTS

| | | | |
|---|---|---|---|
| 4,118,630 | 10/1978 | McKenna et al. | 250/347 |
| 4,135,097 | 1/1979 | Forneris et al. | 250/492.21 |
| 4,249,077 | 2/1981 | Crawford | 250/306 |
| 4,361,762 | 11/1982 | Douglas | 250/492.21 |
| 4,463,255 | 7/1984 | Robertson et al. | 250/251 |
| 4,595,837 | 6/1986 | Wu et al. | 250/492.21 |
| 4,687,987 | 8/1987 | Kuchnir et al. | 324/71.3 |
| 4,783,597 | 11/1988 | Misawa et al. | 250/251 |
| 4,904,902 | 2/1990 | Tamai et al. | 250/492.21 |

OTHER PUBLICATIONS

A. J. T. Holmes, Theoretical & Experimental Study of Space Charge in Intense Ion Beams, Jan. 1979, pp. 389–407, vol. 19, No. 1.
I. H. Hutchinson, Principles of Plasma Diagnostics, pp. 79–84.

Primary Examiner—Jack I. Berman
Assistant Examiner—Kiet T. Nguyen
Attorney, Agent, or Firm—Watts, Hoffmann, Fisher & Heinke Co.

[57] ABSTRACT

A sensor positioned relative to an ion beam for use in an ion implantation system for doping semiconductor wafers. The sensor allows relatively accurate determination of ion beam potential so that steps can be taken to minimize this potential. In a preferred design, a number of electrodes are positioned relative the ion beam and biased at control voltages which allow the ion beam potential to be determined. In one embodiment, the ion beam potential is used to control injection of neutralizing electrons into the ion beam.

11 Claims, 5 Drawing Sheets

ION BEAM POTENTIAL DETECTION PROBE

FIELD OF THE INVENTION

The present invention concerns ion implanters that treat materials by impacting them with ions. More particularly, the invention concerns method and apparatus for monitoring an ion beam potential for such ion implanters.

BACKGROUND ART

It is known in the prior art to dope semiconductor wafers by causing ions to impact the wafers until a specified concentration of ion doping occurs. Typical ion implant systems used for such doping include an ion source and an ion analyzer for insuring ions of an appropriate mass make up the ion beam striking the wafers. As the ion beam passes from the ion source to the wafers, steps are typically also taken to avoid ion beam degradation.

One such step is an attempt to maintain beam neutrality. As ions travel along a beam path to the wafers, they move through a relatively low-pressure gas. Ions impact gas molecules, ionizing them to provide low-energy electrons. The low energy electrons are trapped by the positive space charge potential of the ion beam and partially neutralize the beam, decreasing its space charge divergence. Severe space charge divergence can induce loss in beam transmission and have other negative effects on beam performance.

At the region of the target wafer the value of the beam potential depends upon the impedance to ground of the wafer. If the impedance is large (i.e., the wafer is floating), at equilibrium the wafer potential is equal to the beam potential measured anywhere along the ion beam, so long as the ion beam is isolated from acceleration electrodes used to add energy to the ion beam.

Large ion beam potentials cause the wafers to charge during ion implantation. To increase beam neutralization and hence reduce wafer charging, it is possible to increase the concentration of low-energy electrons. A number of electron concentration control schemes have been devised and currently used with various degrees of success. (10 volts is a typical ion beam potential at the region of the wafer).

Charging of insulated surfaces on the wafer during implantations can result in dielectric breakdown. Gate oxides in high-density devices can be as thin as 10 nm, and although the dielectric strength of $SiO_2$ is quite high (10 megavolt/cm) at these kinds of thicknesses, dielectric breakdown can easily occur.

In high current implanters, typically wafers are placed on a support disk which rotates through a fixed ion beam. The ion beam alternatively impacts the wafers, which are insulated from ground or it impacts the support disk, which is at ground potential. The beam potential at the implantation location is constantly varying and may be an important cause of ion dose non-uniformity.

The ionization of the residual gas along the beam travel path, in addition to creating electrons, also produces an equal amount of low energy gas ions. These slow ions accelerate radially out from the beam due to the space charge of the ion beam and impact the chamber walls that bound the beam path.

One can estimate the level of low-energy ion currents to be expected due to ion interaction with the gas molecules. The scattering rate for ion interaction with a gas molecule is given by $r = n\sigma dI$, where n is the gas density, $\sigma$ the ionization and charge exchange cross sections, d is the beam path length, and I is the beam current. Typically $\sigma = 10^{-15}$ cm$^2$, at a pressure of $10^{-5}$ torr, for d=1 cm, one finds $r = 2 \times 10^{-4} * I$. For a 5 mA ion beam, this results in total energy ion currents of the order of one microamp. The actual low energy ion current that is measured depends on details of the implanter geometry and will also depend upon the beam potential (V) itself.

DISCLOSURE OF THE INVENTION

The present invention concerns method and apparatus for measuring ion beam potential and is used in calibrating or setting up the ion beam. The invention is most preferably used with an ion implanter having an ion source for providing an ion beam which treats on or more semiconductors wafers positioned at an ion implantation station.

A typical ion beam implanter has a beam analyzer that analyzes the ions and directs ions of an appropriate mass to a travel path impacting one or more semiconductor wafers. Such as analyzer typically includes a large ion analyzing magnet for rejecting ions of an inappropriate mass from the ion beam.

A beam neutralizer is often used to inject neutralizing particles into the ion beam before the ion beam reaches the ion implantation station. These neutralizing particles prevent beam blow-up due to mutual space charge repulsion amongst the ions in the beam. A sensor constructed in accordance with the present invention is positioned relative the ion beam travel path for sensing ion beam potential at a location along the beam path subsequent to the beam analyzer.

By monitoring the beam potential at a point along the ion beam prior to impact with the wafers, it is possible to adjust this potential during beam set-up using a suitable beam neutralizing means. By controlling beam potential, wafer charging during the ion implantation can be minimized and doping yields improved.

In a preferred design, the sensor includes a series of electrodes radially removed from the ion beam and biased at control potentials by a power supply. A first electrode is maintained at ground potential so that the ion beam does not degrade due to the presence of the sensor. An additional electrode, radially outward of the first, repels low-energy electrons creating during ion collision with gas particles. Another electrode is biased to repel low-energy ions back to the ion beam and a fourth electrode acts as an electroscope. When the biasing or electric potential maintained on the ion repelling electrode is increased sufficiently to repel all (or most) low energy ions, ion current sensed by the electroscope falls off rapidly in a step like fashion. When this occurs, the control potential on the electrode is equal to the beam potential. By adjusting other beam parameters such as the injection of neutralizing electrons and monitoring the result beam potential, it is possible to reduce wafer charging.

Reversing the sign of the potentials makes it possible to analyze the energy of electrons produced by the ion beam. After the polarity reversal, the electroscope monitors electron current rather than in ion current. From this analysis one can obtain the electron temperature which is also an important beam parameter and can have considerable consequences on beam performance.

One object of the invention is a sensor for monitoring ion beam potential for use in controlling an ion implanter. This and other objects and advantages and features of the invention will become better understood from the detailed description of two alternate embodiments which are described in conjunction with the accompanying drawings.

BEST MODE FOR PRACTICING THE INVENTION

Figure 1:
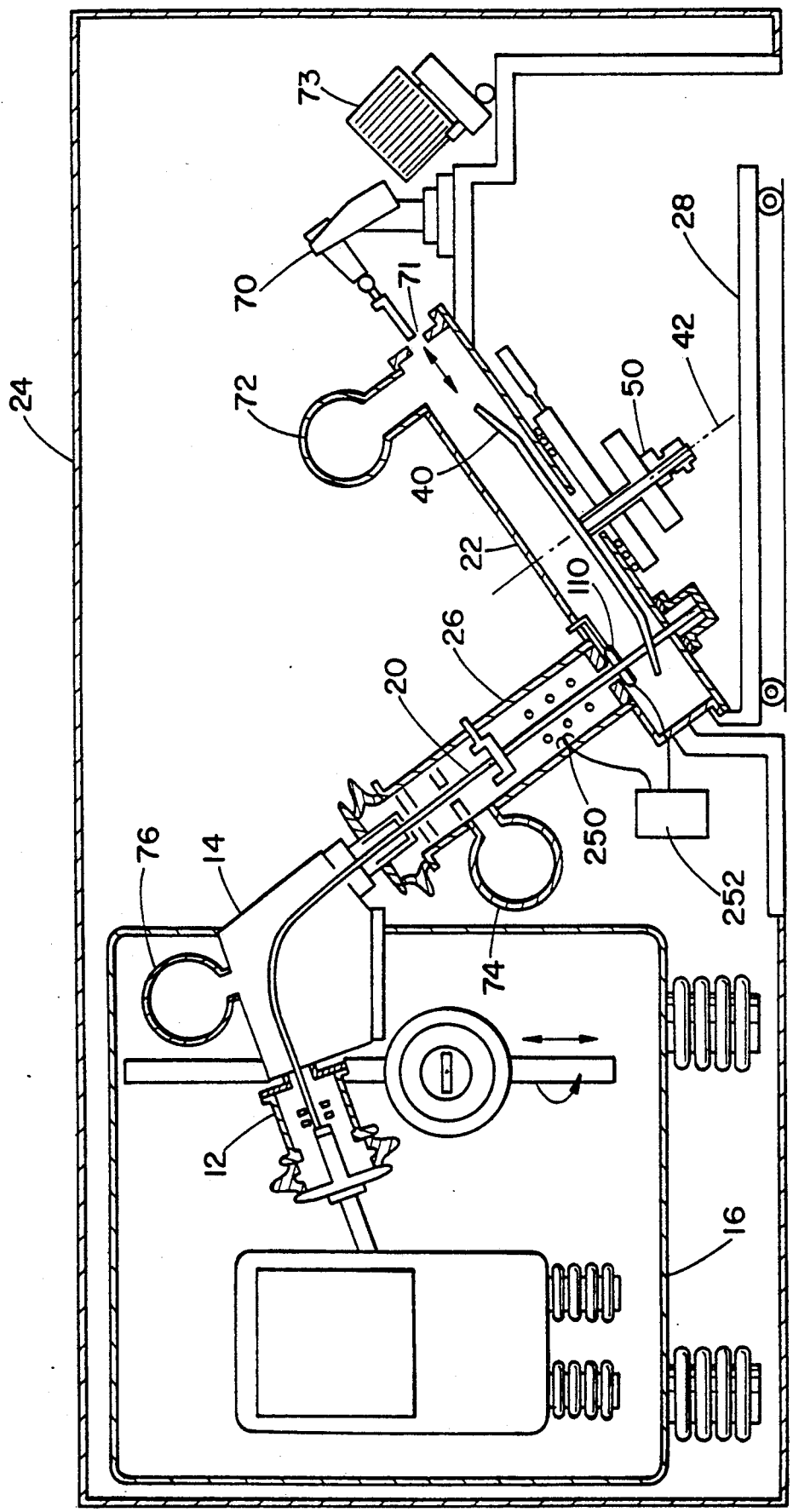
FIG. 1 is a schematic depiction of an ion implanter that directs an ion beam to impact a workpiece such as a semiconductor wafer.

Turning now to the drawings, FIG. 1 depicts an ion implantation system 10 having an ion source 12 and a beam analyzing magnet 14 contained within a high-voltage housing 16. An ion beam 20 emanating from the source 12 is directed to move along a travel path that exits the housing 16 and enters an ion implantation chamber 22 positioned inside a second housing 24. The analyzing magnet 14 causes only those ions having an appropriate mass to form the ion beam 20. Along the travel path from the chamber 16 to the chamber 24, the ion beam 20 passes through a high-voltage isolation bushing 26 before entering the implantation chamber 22.

The ion implantation chamber 22 is supported on a movable pedestal 28. This allows the chamber 22 to be aligned relative to the ion beam. The ion beam impinges upon a wafer support 40 mounted for rotation about an axis 42. The wafer support 40 (FIG. 4) supports multiple silicon wafers 41 and moves those wafers along a circular path so that the ion beam 20 impacts each of the wafers and selectively dopes those wafers with ion impurities. High speed rotation of the support 40 is effected by a motor 50 which rotates the support 40 after the wafers have been placed by the support.

Additional details concerning an ion implantation system of the type described herein are contained in U.S. Pat. No. 4,672,210 to Armstrong et al. The subject matter of this prior art patent is incorporated herein by reference.

Semiconductor wafers are inserted into the ion implantation chamber 22 by a robotic arm 70 through a vacuum port 71. The chamber 22 is evacuated by a vacuum pump 72 to the same pressure as the pressure along the ion beam path. The robotic arm 70 transfer wafers back and forth between a cassette 73 for storing the wafers and the chamber 22. Automatic mechanisms for accomplishing this transfer are well known in the prior art. Two additional pumps 74, 76 evacuate the ion beam path from the source 12 to the implantation chamber 22.

Figure 2:
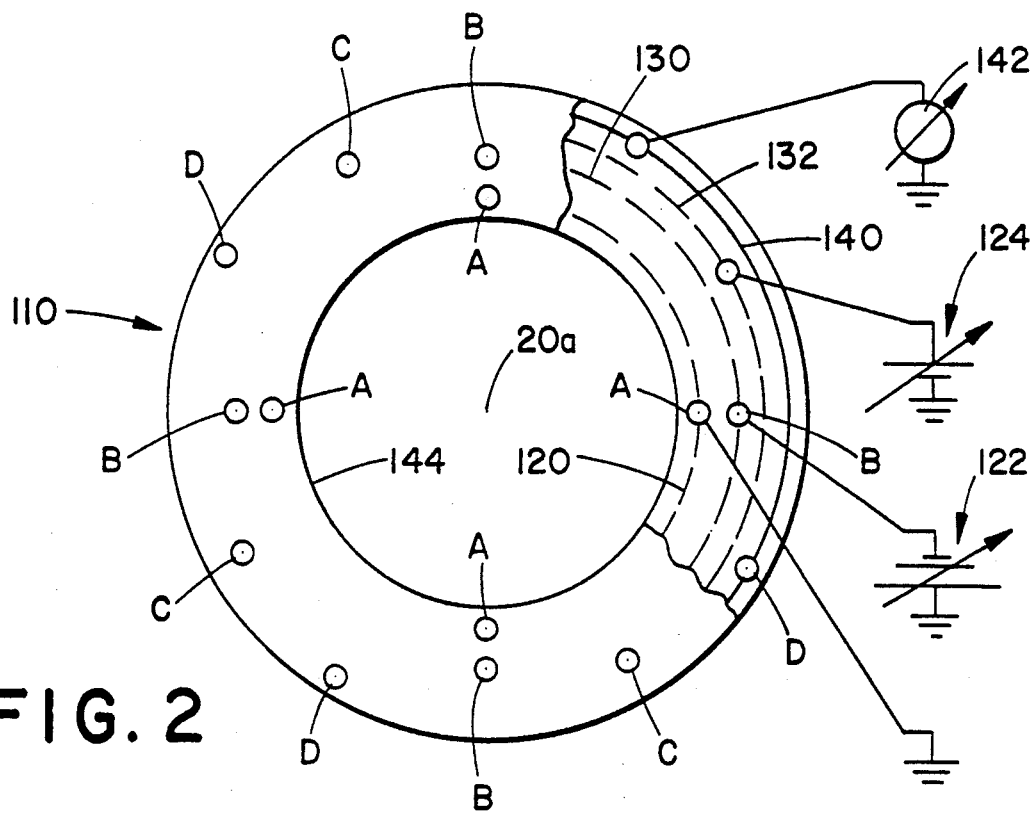
FIG. 2 is a partially-sectioned elevation view of a preferred sensor for monitoring ion beam potential.
Figure 3:
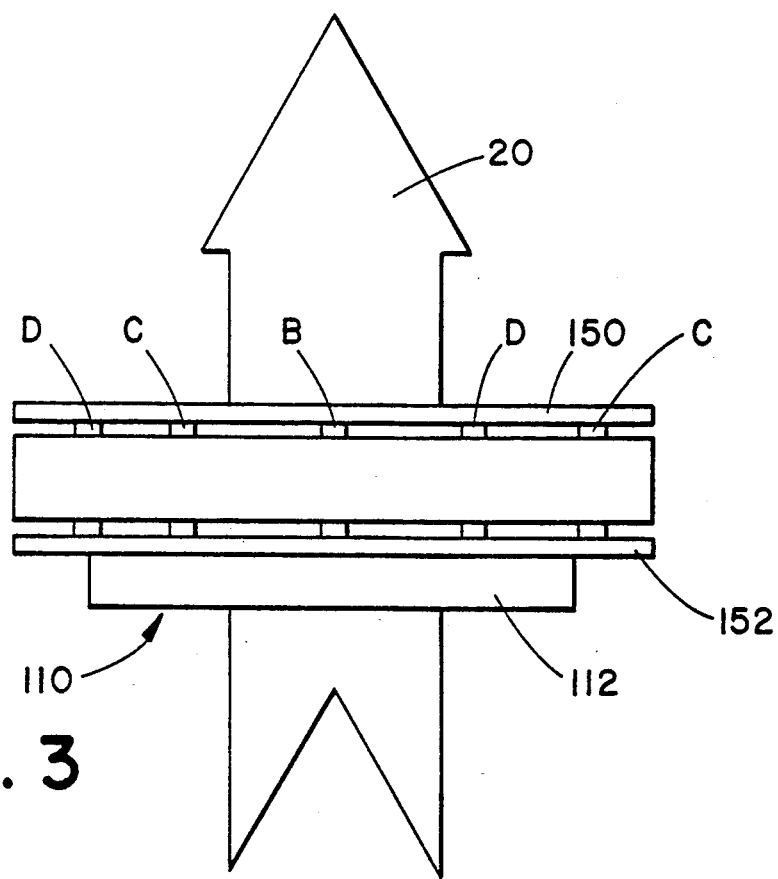
FIG. 3 is a plan view of the FIG. 2 sensor schematically depicting an ion beam passing through the sensor.

Turning now to FIGS. 2 and 3, an ion beam sensor 110 for monitoring the electrical potential of the beam 20 is shown supported relative to the ion beam 20. The sensor 110 includes a support 112 for positioning the sensor relative the ion beam. The location of the ion beam sensor 110 is not critical so long as it is electrically isolated from ion acceleration electrodes and could, for example, be positioned within the chamber 22. In the FIG. 2 embodiment the sensor 110 includes a plurality of metal grids or electrodes biased at control voltages and arranged in circular arrays at well defined distances from the ion beam's central axis 20a. A first set of four insulating posts A spaced at equal angles about the beam support a first cylindrical metal grid or wire mesh 120 maintained at ground potential. By maintaining this grid at a ground potential, the operation of the sensor 110 does not interfere with the ion beam.

Radially outward metal grids are biased at electrical potentials by two power supplies 122, 124. A next set of four insulating posts B supports a metal grid 130 that is maintained at a negative potential with a respect to ground and repels electron current coming from the beam 20. The next set of four insulating posts C supports a metal grid 132 that is biased at a variable positive potential and is used for creating a retarding electric field. This electric field repels slow ions exiting the ion beam and can be varied to adjust the number of these ions reaching a radially outermost metal grid 140 supported by a set of four insulating posts D. This outmost grid 140 is used as an electroscope. An ammeter 142 monitors the current on this grid 140 as the voltage from the power supply 124 varies the voltage on the grid 132. When the ion current sensed by the ammeter 142 on the outermost grid 140 falls in a stepped manner, the retarding potential applied by the power supply 124 has been adjusted to equal the electric potential of ions exiting the ion beam. This is equal to the ion beam potential and it is correlated, for example, in the graph depicting current vs. electrode potential shown in FIG. 5.

The sensor 110 defines a generally circular opening 144 that allows the beam 20 to pass through the sensor. The insulating posts A, B, C and D extend between spaced metal disks 150, 152. The disk 152 is mounted to the sensor support 112 by means of connectors that extend into the disk from the support 112.

Figure 4:
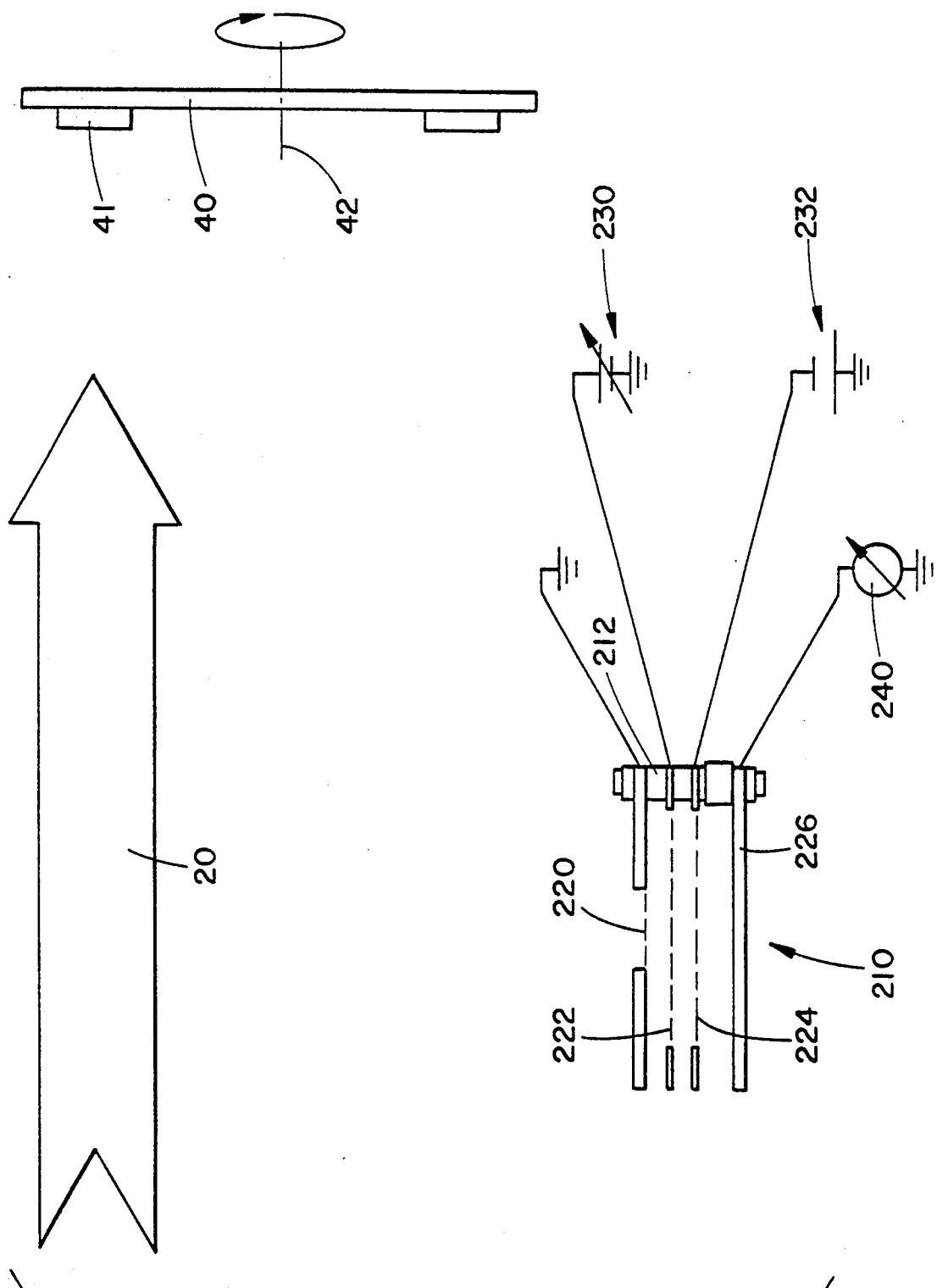
FIG. 4 is a schematic depiction of an alternate sensor for use in monitoring ion beam potential.

An alternate embodiment of a sensor 210 for monitoring beam potential is depicted in FIG. 4. In this embodiment of the sensor 210, a sensor insulating support 212 positions and isolates four electrode grids at a position relative the ion beam 20. A grounded electrode grid 220 reduces the effects of the sensor on the ion beam. A second positively biased grid 222 retards slow ions exiting the ion beam and a third negatively biased grid 224 repels electrons. Finally, the fourth grid 226 is used as an electroscope. Appropriate voltage supplies 230, 232 are coupled to the intermediate grids 222, 224 and an ammeter 240 connected to the outermost grid to determined beam potential. The operation of this sensor 210 is similar to the preferred embodiment 110 except that the sensor 210 does not surround the ion beam.

The output from the sensor is utilized during beam calibration prior to the initiation of an implantation sequence. The ion beam is setup and calibrated to produce a particular beam current and ion energy. During this setup, the ion beam potential can be monitored and steps taken to reduce the monitored potential, thereby reducing wafer charging during ion implantation.

More specifically, an electron flood device 250 (FIG. 1) injects electrons into the ion beam 20. Prior to initiation of an implantation, the beam potential is observed by a control circuit 252 that adjusts the rate electrons are injected into the beam to neutralize the beam.

Figure 5:
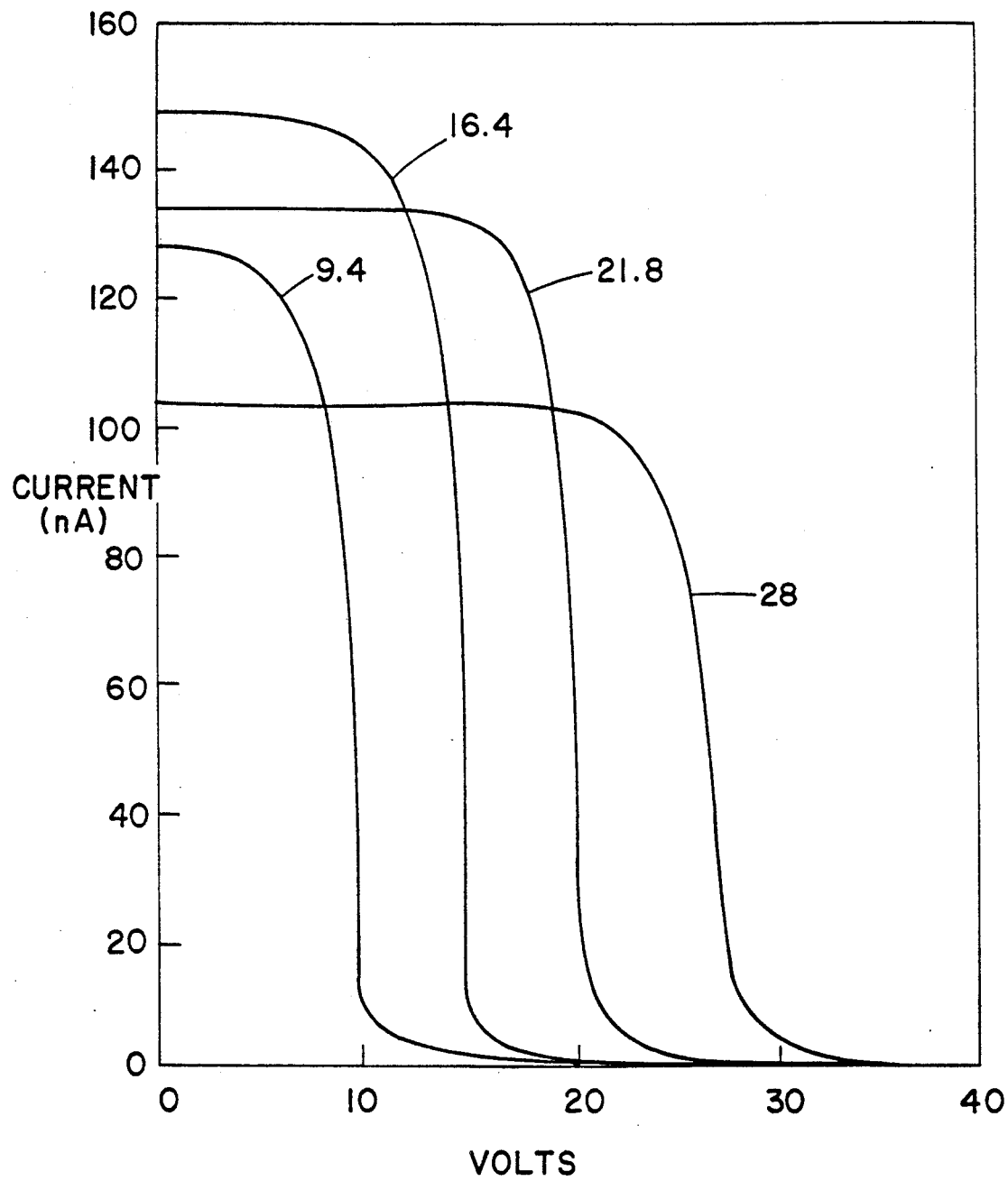
FIG. 5 is a graph of current vs. voltage on an electrode used to determine ion beam potential.

Turning now to FIG. 5, a graph is depicted showing performance of a sensor such as the sensor shown in FIG. 4. Current on the ammeter coupled to the outermost electrode grid is depicted along the ordinate and power supply potential applied to the slow ion repelling electrodes is depicted along the abscissa. The multiple curves depicted in this graph represent various target (wafer) potentials which were varied using a potentiometer and measured with an electrostatic voltmeter. The beam potential measurement follows the measured target voltage quite closely. As the potential on the electrode for repelling slow ions is adjusted, a dramatic drop-off in sensed current on the outermost electrode is experienced at a voltage very close to the wafer potential. During beam setup, the ion beam potential can be monitored and steps taken to this potential.

The disclosed sensors 110,210 can also be used during an implantation after the beam is initially calibrated. During a typical implant the semiconductor wafers are floating above ground and the disk to which they are mounted is grounded. Thus, the target the beam hits is alternating in potential and this affects the ion beam potential. Since the potential measurements are of interest only when the beam is on a wafer of synchronization pulse is used to allow the ammeter output to be sampled only when the beam is impinging on a wafer.

The wafer support 40 typically supports a plurality of wafers 41 about the outer periphery of the support 40. The wafers are spaced by regions less than a wafer diameter. Synchronization pulses can be achieved by ramping a voltage very rapidly to a peak value each time a wafer passes through the beam. Alternatively, the voltage can be synchronized with the rotational speed of the motor 50 so that a synchronization pulse occurs each time a given wafer (of the plurality mounted to the support) is within the ion beam 20.

Figure 6:
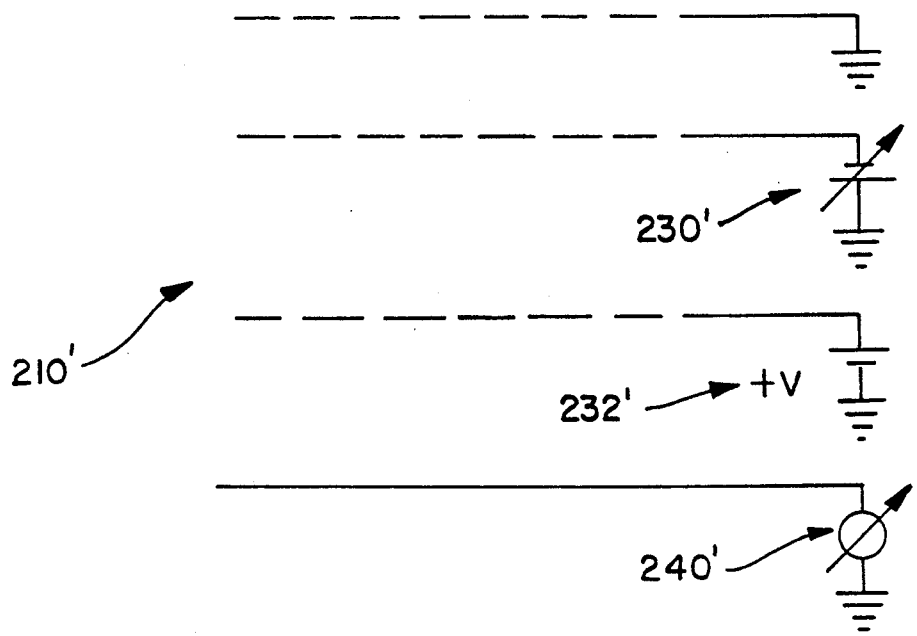
FIG. 6 shows a modified form of the FIG. 4 sensor used to determine electron temperature.
Figure 7:
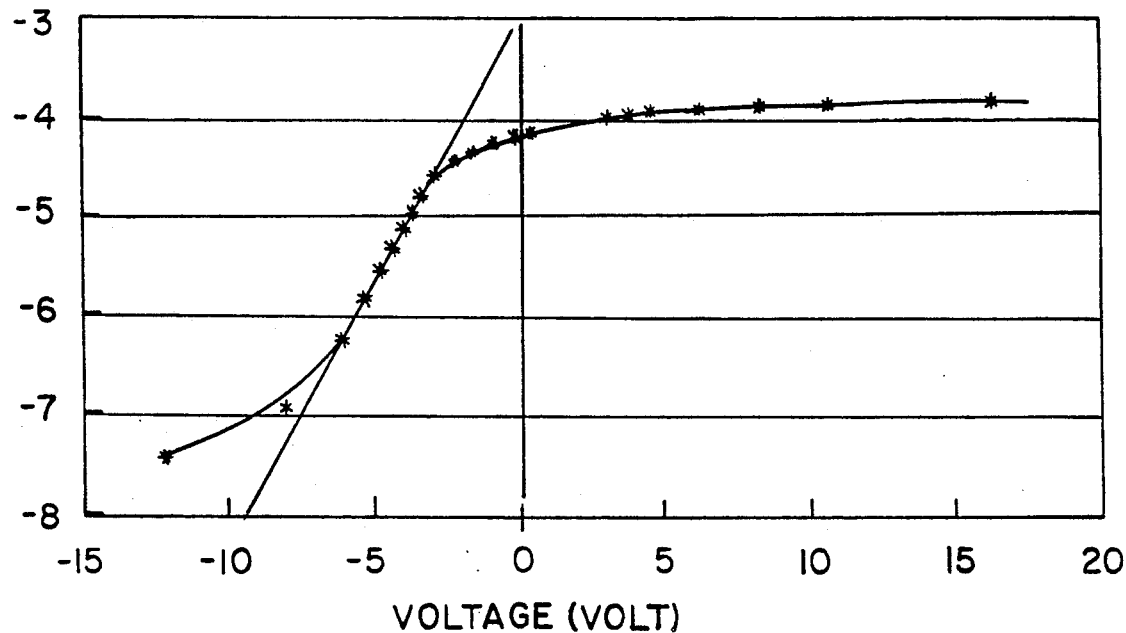
FIG. 7 is a graph of the natural logarithm of current vs. voltage seen when measuring electron temperature.

FIGS. 6 and 7 depict use of a sensor 210' (similar to that shown in FIG. 4) for measuring electron energy. In FIG. 6 the polarity of the power supplies 230',232' is opposite that of the FIG. 4 sensor 210. By adjusting the negative power supply 230' until the output of the ammeter 240' falls off (FIG. 7) the electron temperature in electron volts can be determined from the straight line portion of the logarithm of current vs. voltage graph. The fall off in current takes place at an energy of approximately three electron volts, in this particular case.

Alternate embodiments of a sensor for monitoring ion beam potential are disclosed. It is the intent that the invention include alterations or modifications from these embodiments falling within the spirit or scope of the appended claims.

I claim:

1. An ion implanter comprising:
    a) an ion source for providing an ion beam which treats one or more semiconductor wafers positioned at an ion implantation station;
    b) a beam analyzer for analyzing ions within the ion beam and directing ions of an appropriate mass to a travel path impacting one or more semiconductor wafers at the implantation station;
    c) a beam neutralizer for injecting neutralizing particles into the ion beam prior to the ion beam reaching the wafer implantation station;
    d) a sensor positioned relative the ion beam travel path for monitoring ion beam potential during ion beam calibration and/or implantation comprising a first electrode biased at a control potential to repulse low energy ions leaving the ion beam and further comprising a second electrode for sensing ion current exiting the ion beam as a function of the control potential on the first electrode to determine the ion beam potential;
    e) wafer support structure for positioning the one or more semi-conductor wafers at the implantation station; and
    f) an electronic control for adjusting the rate neutralizing particles are injected into the ion beam based on sensed ion beam potential.

2. The ion implanter of claim 1 wherein the sensor comprises a plurality of cylindrical electrodes and means for biasing the plurality of cylindrical electrodes to sense the electric potential of the ion beam.

3. The ion implanter of claim 2 wherein an outermost cylindrical electrode is used to sense a current of low-energy ions exiting the ion beam and a more readily inward cylindrical electrode is biased at a potential to repulse the low-energy ions exiting the ion beam.

4. The ion implanter of claim 2 wherein positively charged ions form the ion beam and the sensor comprises a first electrode to repulse electrons exiting the ion beam, a second electrode coupled to a control voltage to repulse positively charged ions exiting the ion beam, and a third electrode for determining a magnitude of the control voltage sufficient to prevent ions from reaching the third electrode and thereby given an indication of ion beam potential.

5. A method for determining the electric potential of an ion beam comprising the steps of:
    a) supporting a plurality of electrodes at radially increasing distances from the ion beam;
    b) biasing a first electrode of said plurality of electrodes at a control potential to repulse low-energy ions exiting the ion beam;
    c) positioning a second electrode of said plurality of electrodes at a position radially outward from the first electrode to sense ion current; and
    d) adjusting the control potential while sensing the ion current at the second electrode to determine the electric potential of the ion beam.

6. Apparatus for monitoring an ion beam electric potential comprising:
    a) first and second support disks that include aligned openings to allow an ion beam to move unimpeded through said first and second support disks;
    b) a plurality of metal electrodes arranged concentrically at fixed radii about an axis generally co-incident with an ion beam centerline, supported by and extending between said first and second support disks;
    c) a power supply coupled to a first metal electrode for biasing said first electrode at voltages to deflect electrons leaving the ion beam back into the beam and for biasing a second electrode at an electric potential to deflect slow moving positively charged ions back into the ion beam; and
    d) current sensing means coupled to an additional electrode radially outside the first and second electrode for sensing current at the additional electrode and correlating said beam electric potential with said current as the biasing potential on said second electrode is adjusted.

7. The apparatus of claim 6 additionally comprising a beam neutralizer to control electron concentration in the ion beam and thus adjust the ion beam potential.

8. The apparatus of claim 7 wherein the ion beam neutralizer comprises an electron flood device whose operation is controlled by an input signal coupled to an output from the current sensing means.

9. Apparatus for monitoring an ion beam comprising:
a) a plurality of metal electrodes arranged at fixed distances from an ion beam;
b) a power supply coupled to a first electrode for biasing said first electrode at a voltage to deflect charged particles of a first polarity leaving the ion beam back into the beam and for biasing a second electrode at an electric potential to deflect charged particles of an opposite polarity leaving the ion beam back into the ion beam; and
c) current sensing means coupled to an additional electrode radially outside the first and second electrode for sensing current at the additional electrode and correlating electric potential of the oppositely charged particles with said current as the biasing potential on said second electrode is adjusted.

10. The apparatus of claim 9 wherein the oppositely charged particles are positively charged ions and the energy of the positively charged ions is correlated to the ion beam electric potential.

11. The apparatus of claim 9 wherein the oppositely charged particles are negatively charged electrons and a signal from the current sensing means is used to determine electron temperature.

* * * * *